US009372233B2

(12) United States Patent
Dia (10) Patent No.: US 9,372,233 B2
(45) Date of Patent: *Jun. 21, 2016

(54) SCAN TEST CIRCUIT WITH PULSE GENERATOR FOR GENERATING DIFFERENTIAL PULSES TO CLOCK FUNCTIONAL PATH (71) Applicant: MediaTek Singapore Pte. Ltd., Singapore (SG)

(72) Inventor: Kin Hooi Dia, Hsinchu (TW)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

This patent is subject to a terminal disclaimer.

(21) Appl. No.: 14/529,139

(22) Filed: Oct. 30, 2014

(65) Prior Publication Data

US 2015/0058690 A1 Feb. 26, 2015

Related U.S. Application Data (63) Continuation-in-part of application No. 13/548,176, filed on Jul. 12, 2012, now Pat. No. 8,904,252.

(60) Provisional application No. 61/511,331, filed on Jul. 25, 2011.

(51) Int. Cl.
G01R 31/28 (2006.01)
G01R 31/3185 (2006.01)

(52) U.S. Cl.
CPC ...... *G01R 31/318594* (2013.01); *G01R 31/318541* (2013.01); *G01R 31/318552* (2013.01)

(58) Field of Classification Search
CPC ............... G01R 31/318541; G01R 31/318552; G01R 31/318594; G01R 31/318536; G01R 31/318572; G01R 31/318555; G01R 31/3185; G01R 31/318533
USPC ......... 714/731, 726, 724, 727, 728, 729, 730; 327/100
See application file for complete search history.

(56) References Cited

U.S. PATENT DOCUMENTS

| 6,240,536 | B1 | 5/2001 | Mikan |
| 8,656,238 | B2 | 2/2014 | Lee |
| 2003/0110431 | A1 | 6/2003 | Davies |
| 2007/0300108 | A1 | 12/2007 | Saint-Laurent |
| 2010/0259308 | A1* | 10/2010 | Wang ............... H03K 5/1565 327/175 |
| 2011/0231723 | A1* | 9/2011 | Lee .................. G06F 11/24 714/731 |

FOREIGN PATENT DOCUMENTS

| CN | 1284182 A | 2/2001 |
| CN | 101093243 A | 12/2007 |
| JP | 6160477 | 6/1994 |

\* cited by examiner

*Primary Examiner* — Albert Decady
*Assistant Examiner* — Christian Dorman
(74) *Attorney, Agent, or Firm* — Winston Hsu; Scott Margo (57) ABSTRACT A scan test circuit includes: a pulse generator, for generating differential pulses according to a system clock signal; a functional path, including: a D-type latch clocked by the differential pulses; a test path, including: a scan latch clocked by a test clock signal; and a tri-state inverter. When a test enable signal is enabled, the generation of the differential pulses is disabled.

11 Claims, 9 Drawing Sheets

SCAN TEST CIRCUIT WITH PULSE GENERATOR FOR GENERATING DIFFERENTIAL PULSES TO CLOCK FUNCTIONAL PATH

CROSS REFERENCE TO RELATED APPLICATIONS

This application is a continuation-in-part application of U.S. patent application Ser. No. 13/548,176, which was filed on Jul. 1, 2012, and claims the benefit of provisional application No. 61/511,331, which was filed on Jul. 25, 2011, the contents of which are included herein by reference.

BACKGROUND OF THE INVENTION

1. Field of the Invention

This invention relates to a scan test circuit, and more particularly, to a scan test circuit which utilizes a scan clock signal for inputting test data, wherein the test data is input to a feedback node of the scan test circuit.

2. Description of the Prior Art

Developments in technology and miniaturization of components have enabled hand-held electronic devices such as smart phones and tablet computers to be widely available. An essential part of these electronic devices is the microprocessor. Microprocessors are made up of many storage elements, typically realized by D type flip-flops or latches, wherein data is input to the flip-flop and then output according to an edge transition of a clock.

During a testing mode of a flip-flop, scan test data needs to be input. Conventionally, two types of scan test circuit are utilized. In the first, a scan chain is created by means of multiplexers at the input of each flip-flop. A data signal D, a test data signal TD and a test enable signal TE are input to each multiplexer. When the test enable signal TE is not enabled, the data signal D will be input to the flip-flops in the functional path via the multiplexers, such that the circuit will operate in a normal mode. When the test enable signal TE is enabled, the test data signal TD will be input to the flip-flops in the functional path via the multiplexers, such that the circuit will operate in a test mode. The disadvantage of this circuit is that the data signal D must go through the multiplexers when the circuit is operating in the normal mode, and each multiplexer will add a certain amount of delay to the functional path, as well as increasing the overall circuit area.

To overcome this problem, the second type of scan test circuit utilizes a separate scan chain, wherein the test data TD is input to this separate scan chain and then input to an internal node of the flip-flop or latch (usually, the QBI node). In order for this test data to be input correctly, the normal data input D must be held. This is achieved by creating a long buffer chain for holding a clock signal used for clocking the circuit, such that the test data TD can be input. This increases the complexity of the clock path, as well as increasing the amount of capacitance in the circuit as test data is input to the feed forward node of the circuit.

In short, the implementation of either circuit will result in a trade-off between power consumption and timing delay in the functional path.

SUMMARY OF THE INVENTION

With this in mind, the invention aims to provide a scan test circuit which can achieve fast data-to-output timing while reducing the complexity and power consumption of the circuit.

A scan test circuit comprises: a pulse generator, for generating differential pulses according to a system clock signal; a functional path, comprising: a D-type latch, for receiving an input and generating an output, the D-type latch including a feedback node and being clocked by the differential pulses; a test path, comprising: a scan latch, for receiving a test input according to a test enable signal and generating an output, the scan latch being clocked by a test clock signal; and a tri-state inverter. The output of the test path is input to the feedback node of the D-type latch and the tri-state inverter, and when the test enable signal is enabled, the generation of the differential pulses is disabled.

In an exemplary embodiment of the invention, the pulse generator comprises: an inverter gate, for receiving the system clock signal and outputting an inverted clock signal; a delay circuit comprising a plurality of delay elements, for receiving the inverted clock signal and outputting a delayed inverted clock signal; a NOR gate, having the inverted clock signal as a first input and the delayed inverted clock signal as a second input and generating one of the differential pulses as an inverted pulsed clock signal according to the first input and second input; and an inverter gate, for receiving the inverted pulsed clock signal and generating the other of the differential pulses as a pulsed clock signal.

In an exemplary embodiment of the invention, the D-type latch is realized by: a first inverter for receiving the input; a transmission gate coupled to the first inverter and clocked by the pulses; a latch tri-state inverter coupled to the transmission gate, the first tri-state inverter comprising the feedback node and being clocked by the pulses; and a second inverter, coupled to the first tri-state inverter, for generating the output.

In an exemplary embodiment of the invention, the scan latch is realized by: a first test inverter for receiving the test input; a first transmission gate coupled to the first test inverter and clocked by the test clock signal; a second test inverter coupled to the first transmission gate; a tri-state buffer coupled to the second test inverter and clocked by the test clock signal; and a second transmission gate, coupled in parallel to the first transmission gate and coupled to the tri-state buffer, and clocked by the test clock signal, for generating the output to the feedback node of the functional path and the tri-state inverter.

The scan test circuit further comprises a clock generator for generating the test clock signal. The clock generator comprises: a NAND gate having a first input coupled to the test enable signal and a second input coupled to the system clock signal, for generating an inverted test clock signal; and an inverter coupled to the NAND gate, for generating the test clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
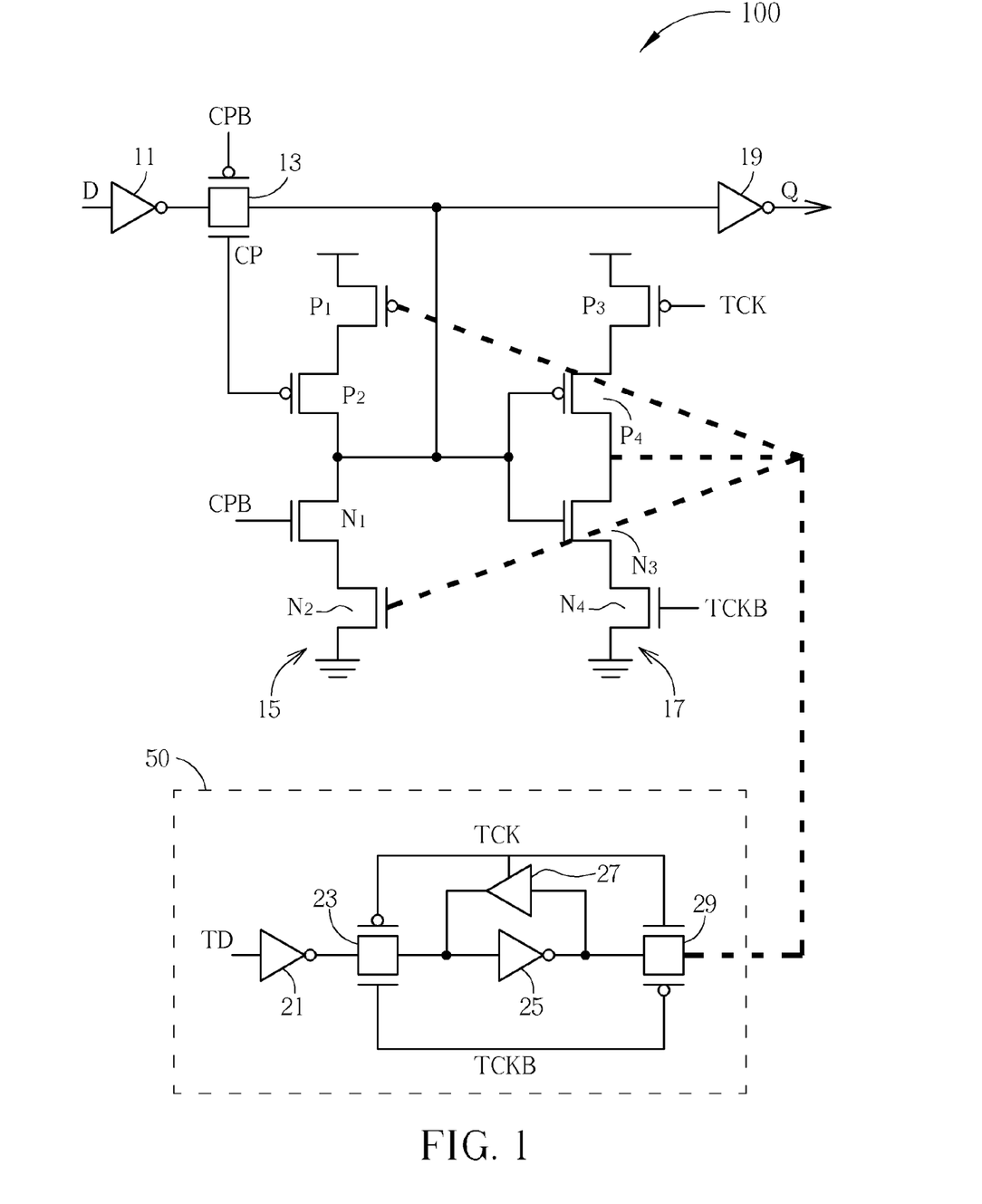
FIG. 1 is a block diagram of a scan test circuit according to an exemplary embodiment of the present invention.

Please refer to FIG. 1, which is a block diagram of a scan test circuit 100 according to a first embodiment of the present invention. As shown in the diagram, the scan test circuit 100 comprises a functional path, which consists of a first inverter 11 for receiving the data input D, a transmission gate 13 coupled to the first inverter 11 and clocked by differential pulses CP, CPB generated by a pulse generator (illustrated in FIG. 8), a first tri-state inverter 15 coupled to the transmission gate 13, the first tri-state inverter 15 including a feedback node at the gate of PMOS P1 and being clocked by the pulses CP, CPB, and a second inverter 19, coupled to the first tri-state inverter 15, for generating the output Q. As one skilled in the art will realize, this layout is an example of a D-type latch circuit.

The scan test circuit also includes a scan test path, which consists of a first test inverter 21 for receiving the test data input TD, a first transmission gate 23 coupled to the first test inverter and clocked by a differential test clock signal TCK, TCKB, a second test inverter 25 coupled to the first transmission gate 23 and coupled to a tri-state buffer 27, wherein the tri-state buffer 27 is clocked by the test clock signals TCK, TCKB, and the output is fed back to the first transmission gate 23 and to a second transmission gate 29 which is coupled in parallel to the first transmission gate 23 and is also clocked by the test clock signals TCK, TCKB. As one skilled in the art will realize, this layout is an example of a scan latch circuit 50.

Rather than inputting the test data input to the functional path via the QBI node, as in conventional scan circuits, the exemplary scan test circuit 100 inputs the test data TD via the feedback node. As illustrated in the diagram by the dashed lines, the output of the scan latch circuit 50 is input to the un-clocked PMOS P1 and NMOS N2 of the first tri-state inverter 15. In addition, the scan test circuit 100 includes a second tri-state inverter 17, coupled between the transmission gate 13 in the functional path and the second inverter 19. This second tri-state inverter 17 is clocked by the test clock signals TCK, TCKB.

By inputting the test data via the feedback node, the amount of capacitance on the QBI node is significantly reduced in comparison with conventional circuits which push the test data into the internal node. Therefore, while achieving a reduction in delay time for the functional path gained by having a separate test path, there is also no trade-off in terms of power. This arrangement also means that no extra circuits need to be added to the functional path, as well as allowing the scan path to be realized by regular circuitry. Therefore, both the functional path and the test path have minimal timing restrictions with respect to standard requirements.

Figure 6:
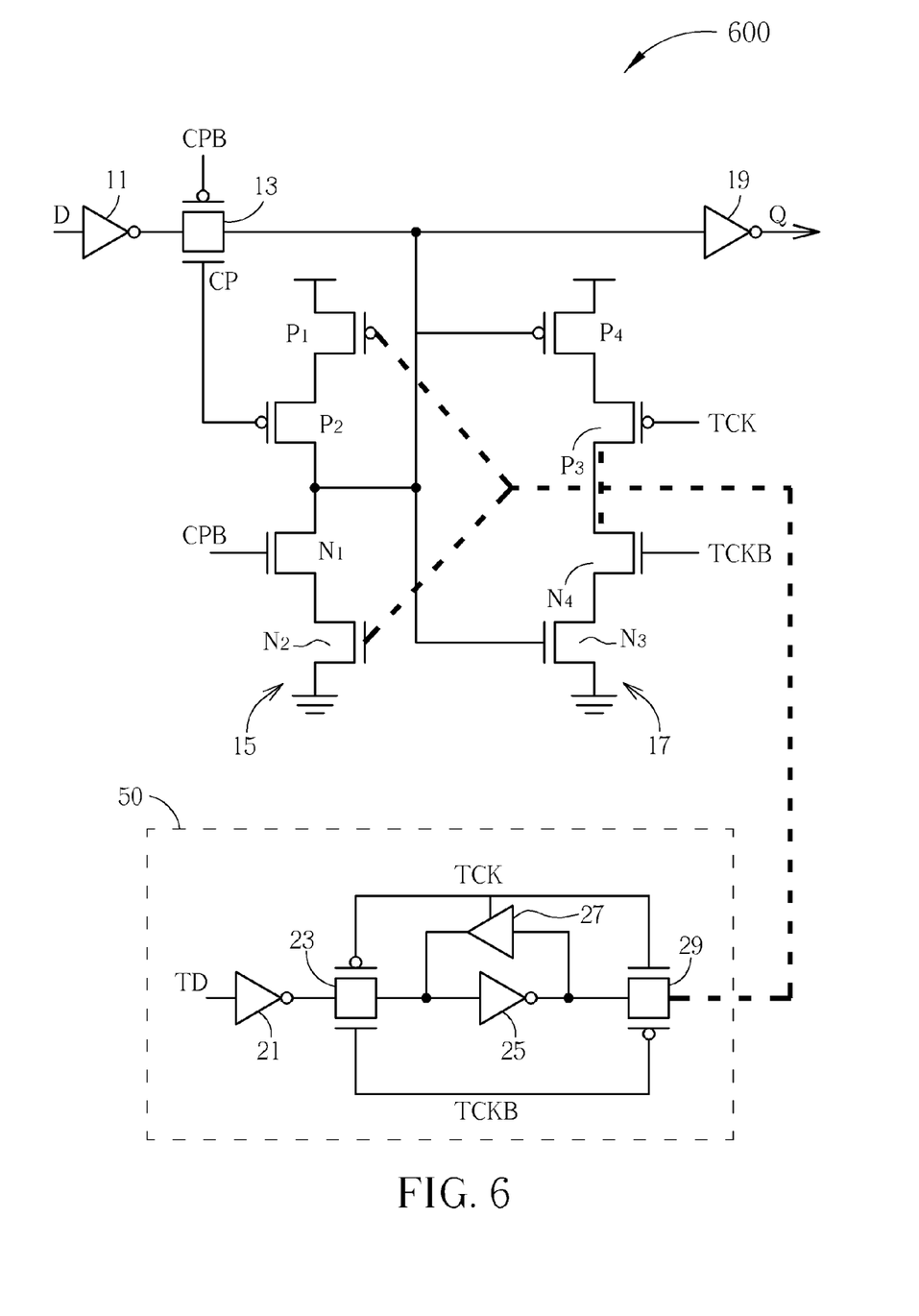
FIG. 6 is a block diagram of an alternative arrangement of the scan test circuit shown in FIG. 1.
Figure 7:
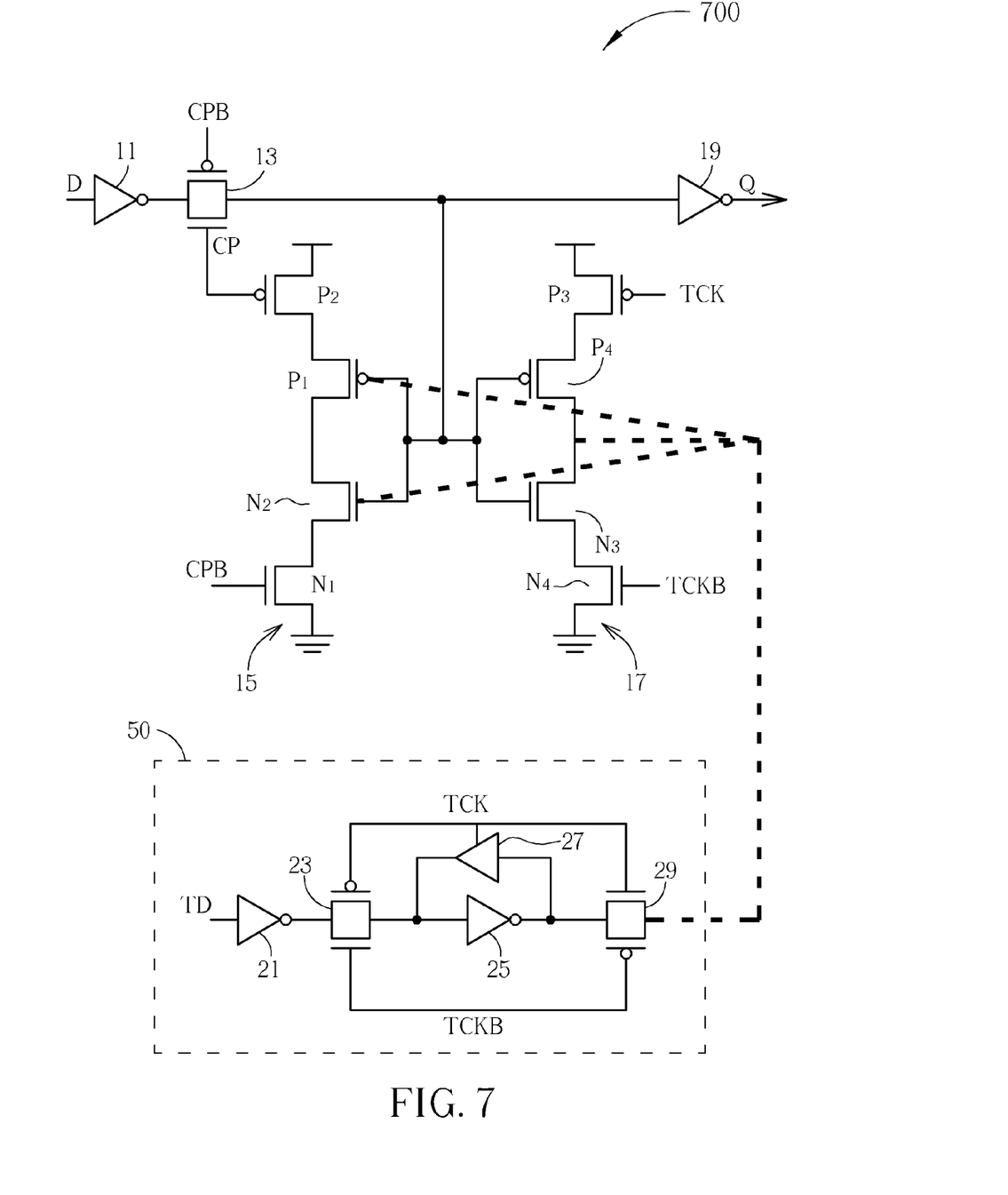
FIG. 7 is a block diagram of another alternative arrangement of the scan test circuit shown in FIG. 1.

It will be appreciated by one skilled in the art that the PMOS devices and NMOS devices need not be arranged in the exact manner illustrated in FIG. 1. FIG. 6 and FIG. 7 show alternative schematics of the scan test circuit 100. In the scan test circuit 600 illustrated in FIG. 6, the locations of P3 and P4 are interchanged, as are the locations of N3 and N4. In the scan test circuit 700 illustrated in FIG. 7, the locations of P1 and P2 are interchanged, as are the locations of N1 and N2. As these different circuit arrangements achieve the same objective as the scan test circuit 100 and the devices illustrated therein operate according to the same principles, further description will not be provided. Additionally, devices illustrated in FIG. 1 are annotated with the same numerals in FIG. 6 and FIG. 7.

Figure 2:
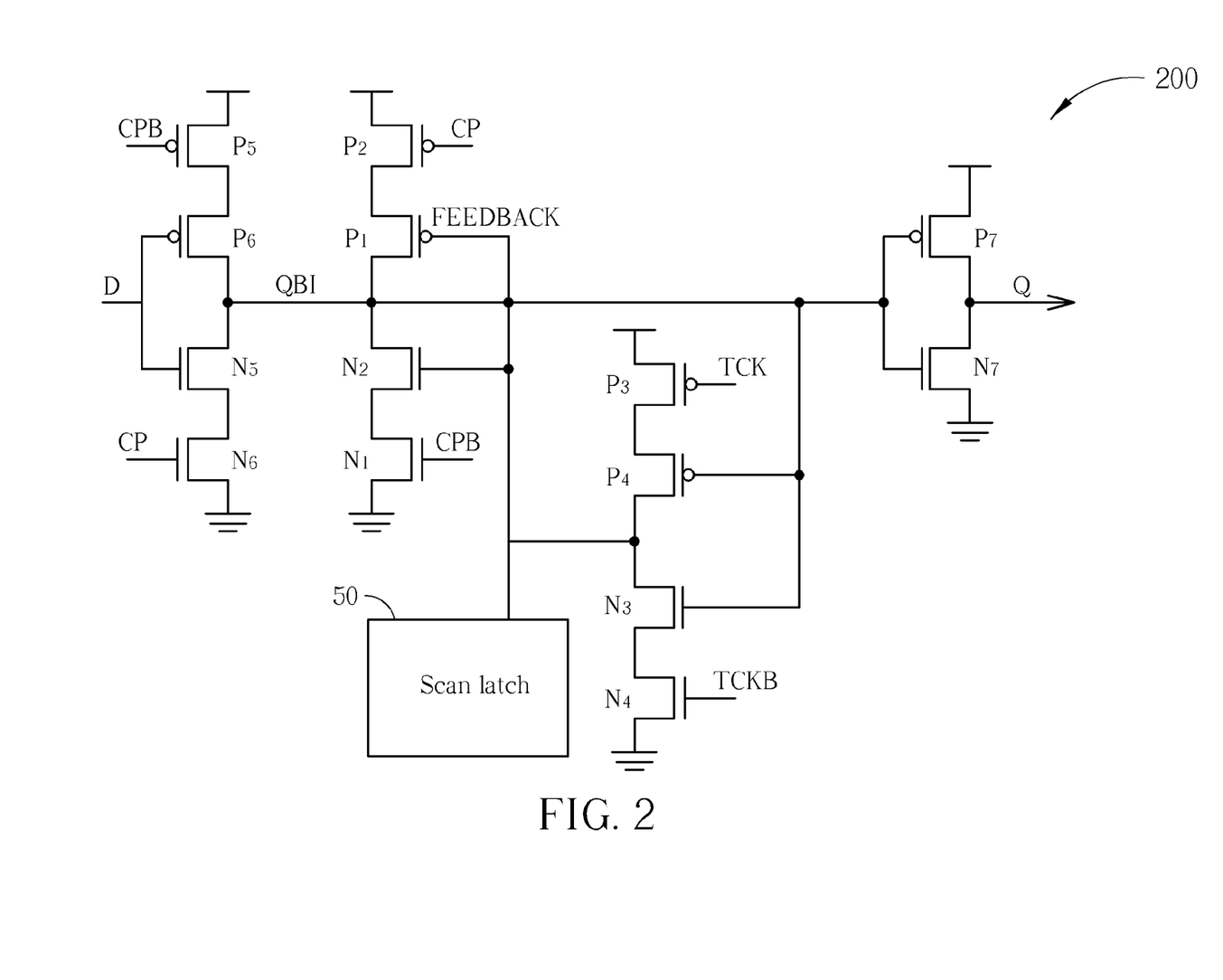
FIG. 2 is a CMOS level diagram of the scan test circuit shown in FIG. 1.
Figure 3:
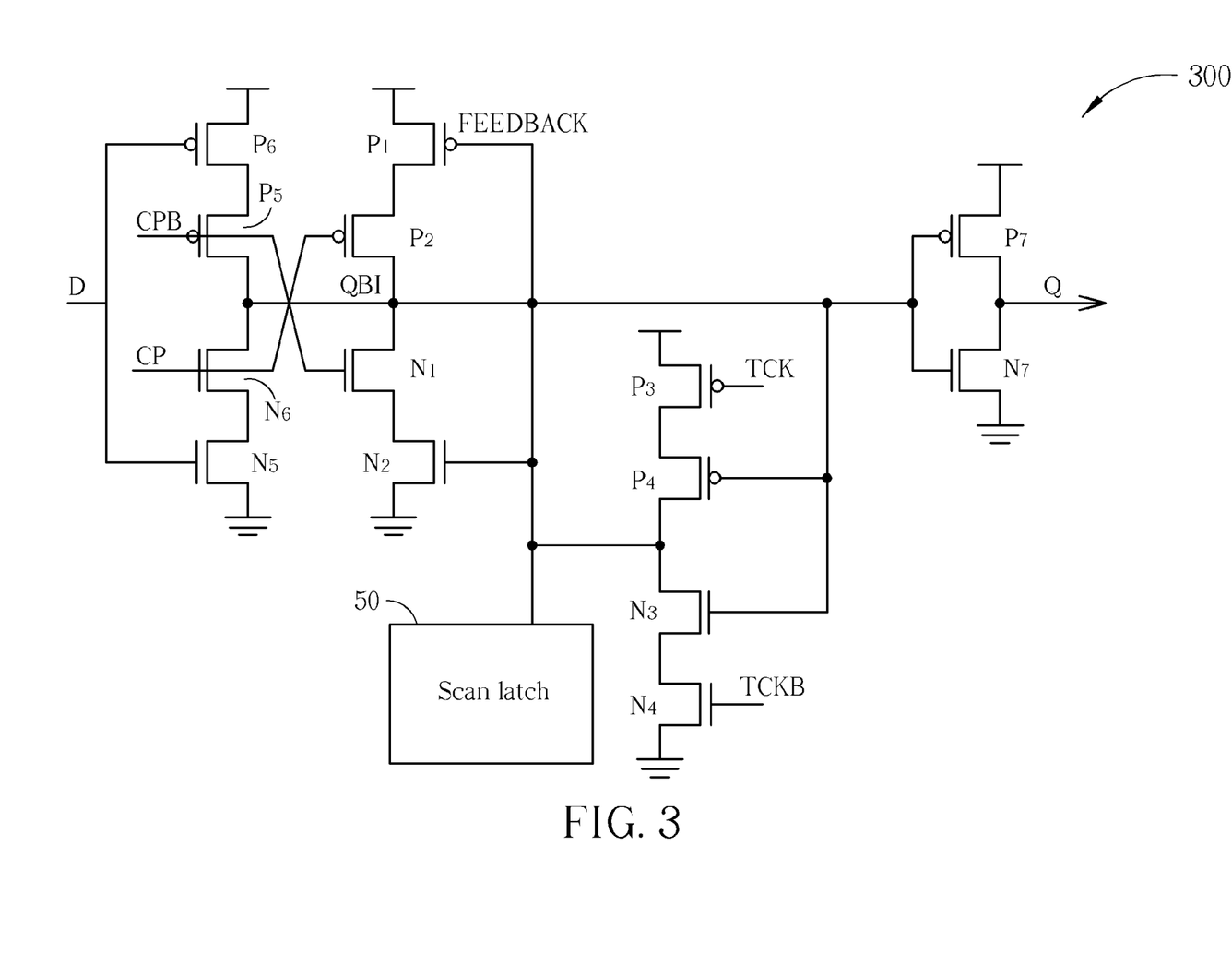
FIG. 3 is a CMOS level diagram of a scan test circuit according to a second embodiment of the present invention.

Please refer to FIG. 2, which is a CMOS level diagram 200 of the scan test circuit 100 illustrated in FIG. 1, and also to FIG. 3, which is a CMOS level diagram 300 of the scan test circuit 100 according to a second embodiment. In both embodiments, the scan latch circuit 50 is the same and is therefore illustrated as a simple block diagram. As shown in FIG. 2 and FIG. 3, the only difference between the two embodiments is the position of the clock and data inputs in the stack. The second embodiment, illustrated in FIG. 3, utilizes data inverters in the functional path, such that the clock is in the middle of the stack and the data inputs are on the outside. As one skilled in the art will understand, the function of the second embodiment also falls within the above-described scope. Further details are therefore not included here for brevity.

In the following, the operation of the scan test circuit 100 with respect to input signals and normal and test mode will be detailed. During normal mode, the data is input to the functional path and clocked by pulses CP, CPB generated by a pulse generator (illustrated in FIG. 8). The pulse generator can be a conventional pulse generator which generates pulses on a rising edge of a system clock signal CK. In standard systems, when test data is being input, the generated pulses for the functional path are held in long buffer chains. This creates a power drain during test mode and also requires increased circuit area. In order to overcome these disadvantages, the present invention utilizes the existing clock circuitry (i.e. the system clock signal CK) and a test enable signal TE to generate a differential test clock signal TCK, TCKB. The test enable signal TE is also utilized to disable the generation of the pulses, such that when test mode is entered, the scan test circuit 100 will operate in accordance with the test clock signals TCK, TCKB. As these test clock signals can be generated by simple circuitry, the amount of power used during test mode is reduced with respect to conventional systems.

Figure 4:
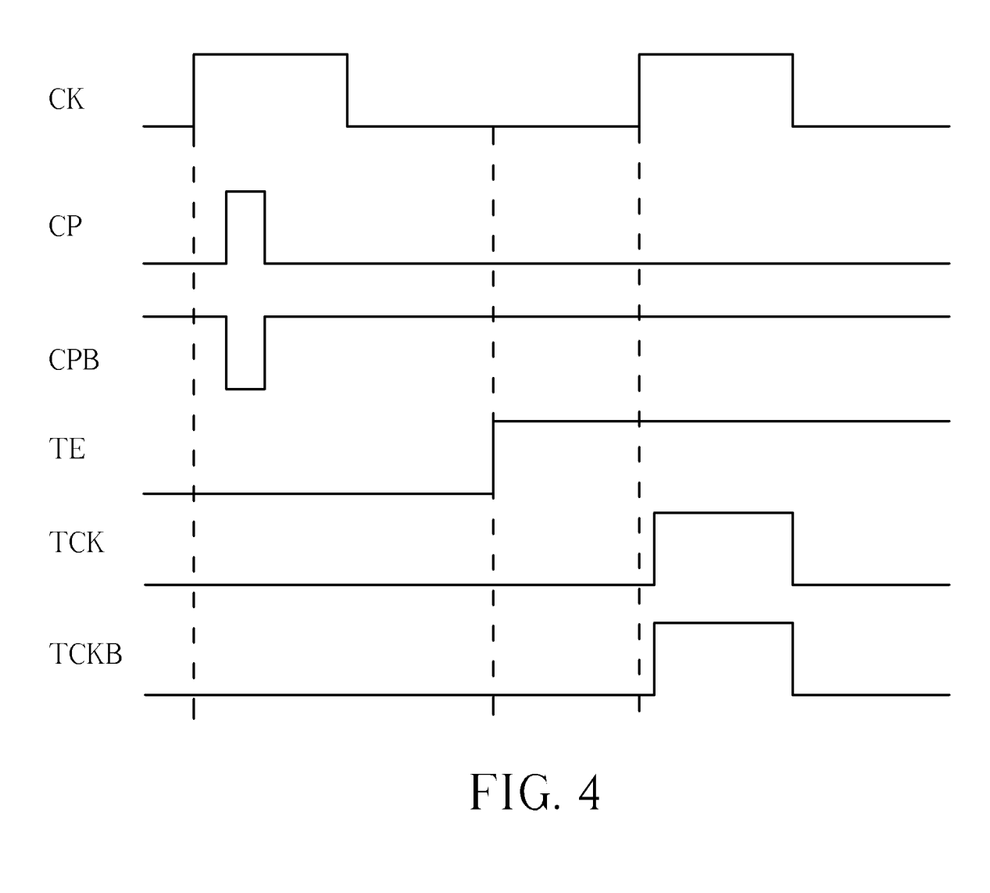
FIG. 4 is a timing diagram of signals in the test path of the scan test circuit according to an exemplary embodiment of the present invention.

Please refer to FIG. 4, which is a timing diagram of various operating signals for the scan test circuit 100 illustrated in FIG. 1. The rising edge of the system clock signal CK triggers pulses CP, CPB, wherein these pulses are generated by a pulse generator (illustrated in FIG. 8). As shown in the timing diagram, the pulses CP, CPB are generated a certain time after the rising edge of the system clock signal CK. This will be detailed further in the accompanying description of FIG. 8. Test enable signal TE goes high at a point between a falling edge and a rising edge of the system clock signal CK. This is to ensure that a full cycle of the system clock signal can be utilized to immediately begin entering test data. Once the TE signal goes high, the generation of the pulses CP, CPB will be disabled. The TE signal also enables generation of the test clock signals TCK, TCKB. Because the differential test clock signal is generated by a simple logic circuit, as illustrated in FIGS. 5A and 5B, the delay between the rising edge of the system clock signal CK and the rising edge of the test clock signal TCK is very small.

Figure 5A:
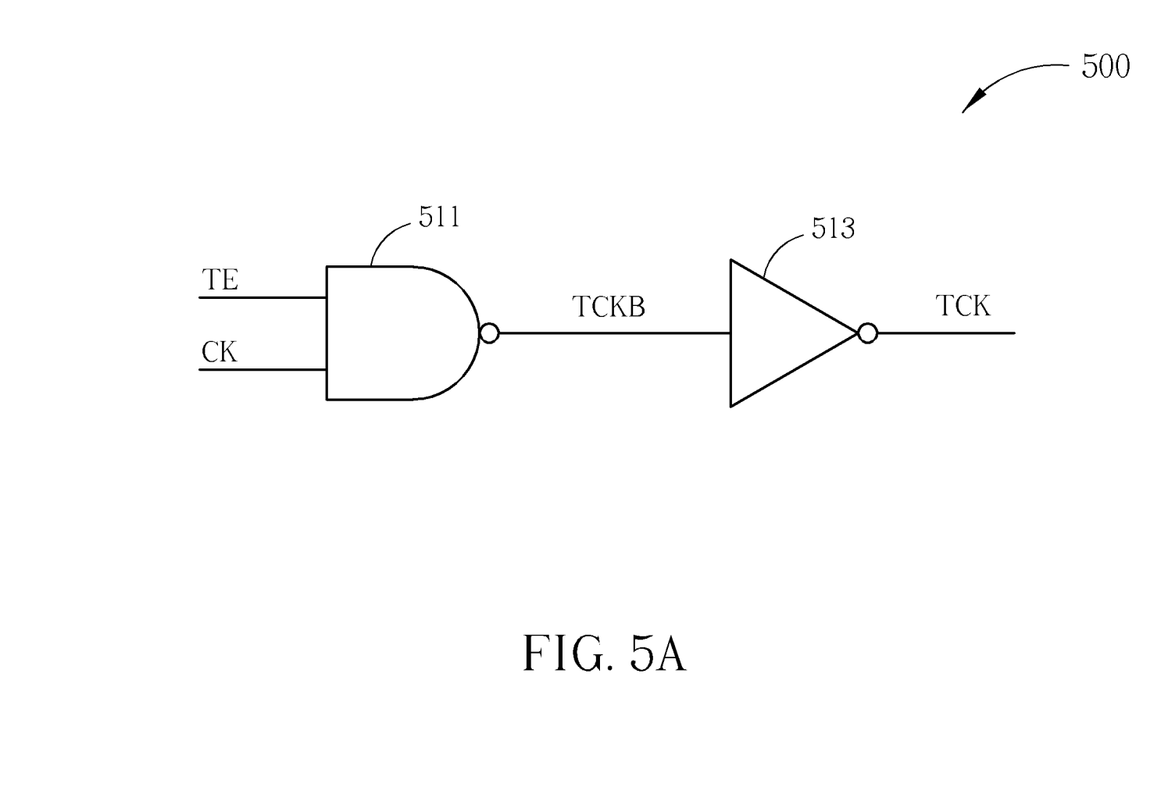
FIG. 5A is a block diagram of a test clock generator according to an exemplary embodiment of the present invention.
Figure 5B:
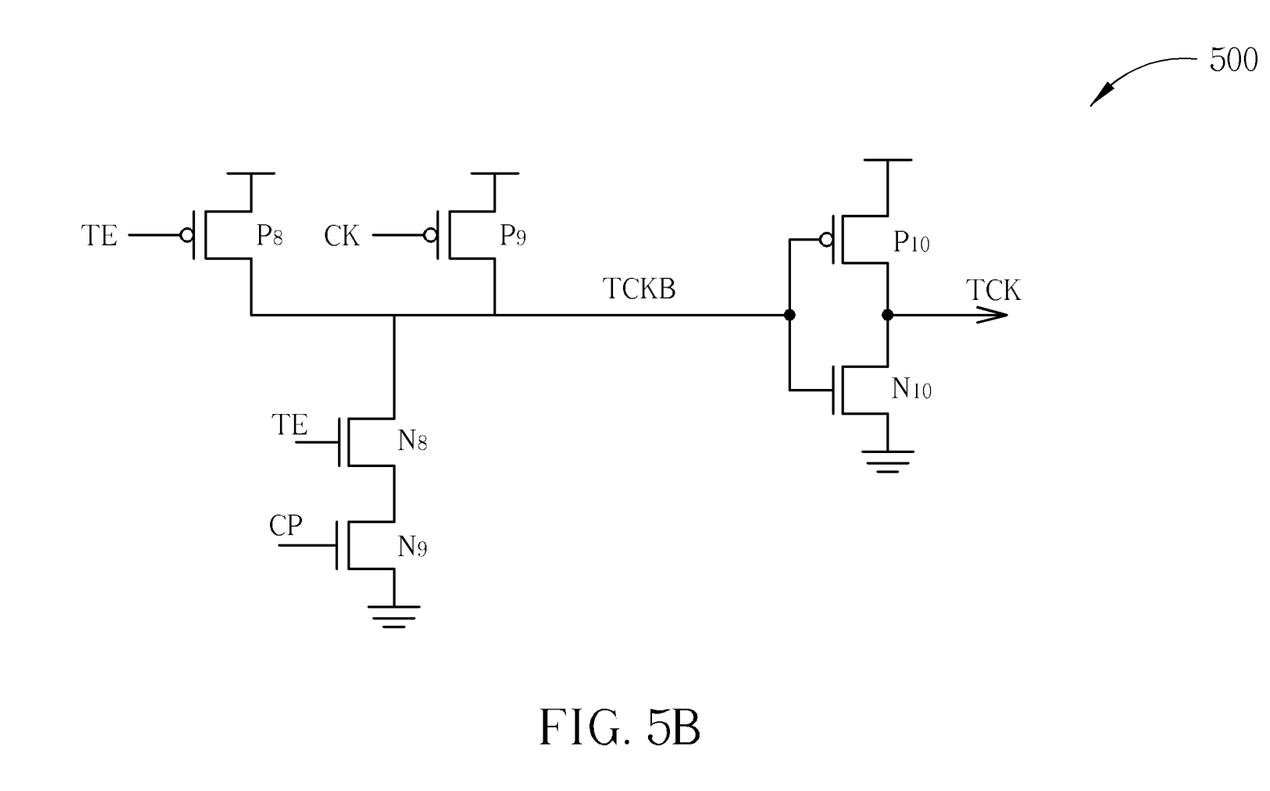
FIG. 5B is a CMOS level diagram of the test clock generator illustrated in FIG. 5A.

Please refer to FIGS. 5A and 5B which illustrate, respectively, a block level diagram and a CMOS level diagram of the clock generator 500. As shown in the figures, a NAND gate 511 receives the TE signal and the system clock signal CK and generates an inverted test clock signal TCKB. This test clock signal is coupled to an inverter 513, for generating the test clock signal TCK. The simple circuit means there will only be slight delay between the rising edge of the system clock signal CK and the rising edge of the test clock signal TCK.

Figure 8:
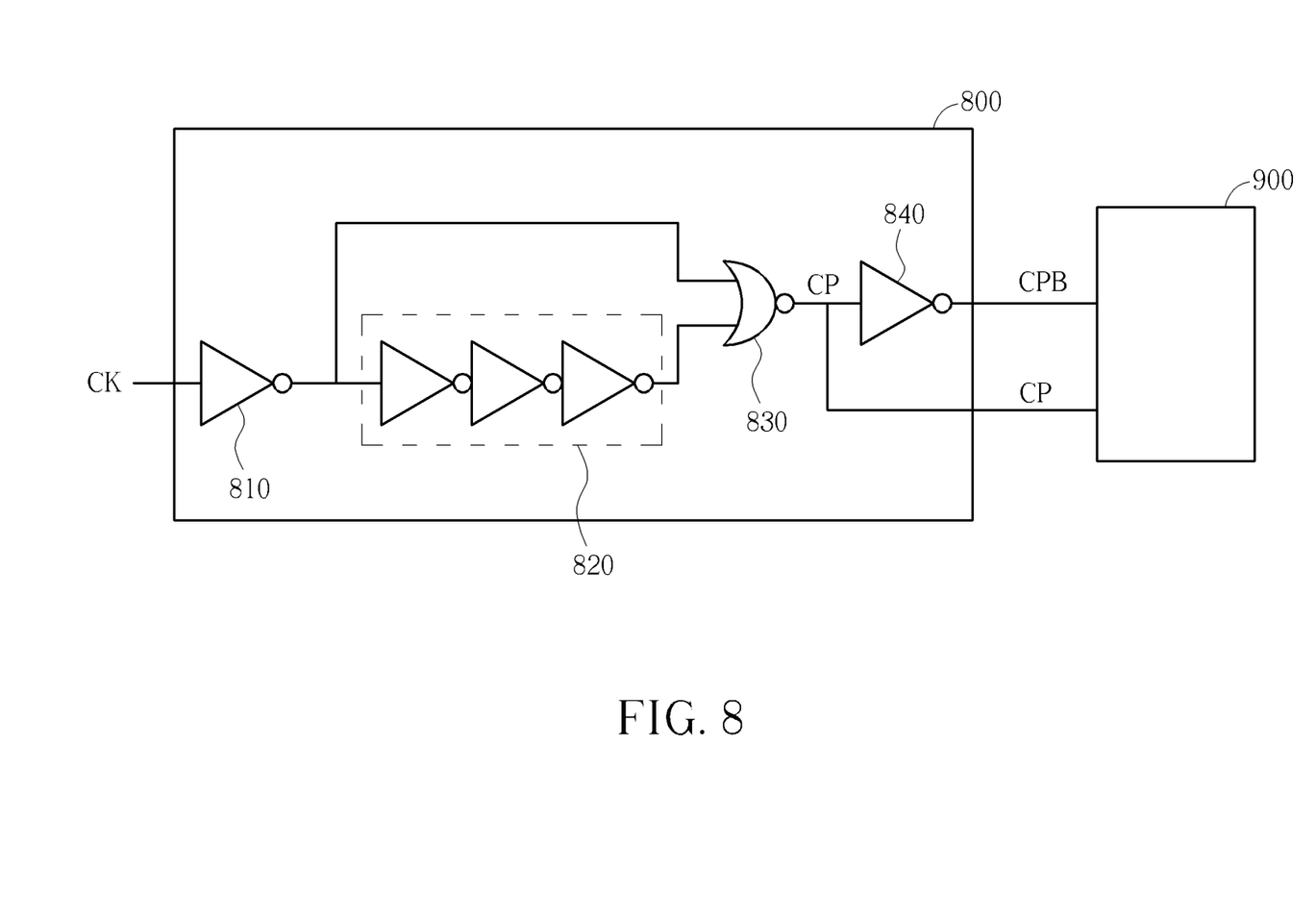
FIG. 8 is a circuit diagram illustrating an exemplary embodiment of a pulse generator for generating the clocked pulse signal shown in FIG. 1, FIG. 2, FIG. 3, FIG. 6 and FIG. 7.

FIG. 8 is a diagram of a pulse generator 800 for generating the differential pulses CP, CPB. Note that the illustrated pulse generator can be applied to any of the circuits/architectures shown in FIG. 1, FIG. 2, FIG. 3, FIG. 6 and FIG. 7. Element 900, which is illustrated in FIG. 8 and receives the differential pulses CP, CPB, can represent any of circuits 100, 200, 300, 600 or 700, or other circuits for receiving differential pulses, and is not included in a limiting sense.

The pulse generator 800 comprises an inverter 810, a delay circuit 820 consisting of a plurality of delay elements, a NOR gate 830 and an inverter 840. The number of delay elements shown in FIG. 8 is three, but this is merely for illustrative purposes, and is not a limitation of the invention.

The inverter 810 receives the system clock signal CK and generates an inverted clock signal. This inverted clock signal is input to the delay circuit 820, and passes through the plurality of delay elements to generate a delayed inverted clock signal. As illustrated in the timing diagram of FIG. 4, the pulses CP, CPB will be generated a certain time after the rising edge of the system clock signal CK, due to the inclusion of the delay circuit 820. The use of the delay circuit 820 means that a more stable clock signal can be generated, and therefore the generated pulses will be more accurate. The NOR gate 830 receives the output of the inverter 810 (i.e. the inverted clock signal) at its first input and receives the output of the delay circuit 820 (i.e. the delayed inverted clock signal) at its second input, and generates a pulsed signal CP. This pulsed signal is further input to the inverter 840 to generate an inverted pulsed signal CPB. The differential pulses CP, CPB can then be input to any of the circuits 100, 200, 300, 600 or 700 shown, respectively, in FIG. 1, FIG. 2, FIG. 3, FIG. 6 and FIG. 7, and represented by the generic block 900 in this figure.

In summary, the present invention provides a scan test circuit wherein test data is fed into the feedback node of the functional path. This reduces the capacitance on the internal node with respect to conventional circuits which feed the test data into the internal node QBI, as well as minimizing impact to speed of the functional path caused by the test path. Test data is fed in accordance with a differential test clock signal which is generated utilizing the existing system clock signals. The simple clock path means that power can be reduced during test mode with respect to conventional scan circuits. In addition, the test enable signal is utilized to disable the generation of pulses utilized for clocking the functional path during normal mode, such that no extra circuitry is required for the functional path. The present invention therefore provides a scan test circuit with fast data-to-output timing for both normal and test modes, simple circuitry and reduced power with respect to conventional circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A scan test circuit, comprising:
   a pulse generator, for generating differential pulses according to a system clock signal;
   a functional path, comprising:
      a D-type latch, for receiving an input and generating an output, the D-type latch including a feedback node and being clocked by the differential pulses, the D-type latch comprising:
         a first inverter for receiving the input;
         a transmission gate coupled to the first inverter and clocked by the differential pulses;
         a latch tri-state inverter coupled to the transmission gate, the latch tri-state inverter comprising the feedback node and being clocked by the differential pulses; and
         a second inverter, coupled to the latch tri-state inverter, for generating the output;
   a test path, comprising:
      a scan latch, for receiving a test input according to a test enable signal and generating an output, the scan latch being clocked by a test clock signal, the scan latch comprising:
         a first test inverter for receiving the test input;
         a first transmission gate coupled to the first test inverter and clocked by the test clock signal;
         a second test inverter coupled to the first transmission gate;
         a tri-state buffer coupled to the second test inverter and clocked by the test clock signal; and
         a second transmission gate, coupled in parallel to the first transmission gate and coupled to the tri-state buffer, and clocked by the test clock signal, for generating the output to the feedback node of the functional path and the tri-state inverter; and
   a tri-state inverter, coupled to the test path and the functional path;
   wherein the output of the test path is input to the feedback node of the D-type latch and the tri-state inverter, and when the test enable signal is enabled, the generation of the differential pulses is disabled.

2. The scan test circuit of claim 1, wherein the pulse generator comprises:
   an inverter gate, for receiving the system clock signal and outputting an inverted clock signal;
   a delay circuit comprising a plurality of delay elements, for receiving the inverted clock signal and outputting a delayed inverted clock signal;
   a NOR gate, having the inverted clock signal as a first input and the delayed inverted clock signal as a second input and generating one of the differential pulses as an inverted pulsed clock signal according to the first input and second input; and
   an inverter gate, for receiving the inverted pulsed clock signal and generating the other of the differential pulses as a pulsed clock signal.

3. The scan test circuit of claim 2, wherein the test clock signal is generated according to the system clock signal and the test enable signal.

4. The scan test circuit of claim 3, further comprising:
   a clock generator for generating the test clock signal, comprising:
      a NAND gate having a first input coupled to the test enable signal and a second input coupled to the system clock signal, for generating an inverted test clock signal; and
      an inverter coupled to the NAND gate, for generating the test clock signal.

5. The scan test circuit of claim 3, wherein the test clock signal is generated according to a rising edge of the system clock signal.

6. The scan test circuit of claim 5, wherein the test enable signal is enabled at a time between a falling edge and a directly following rising edge of the system clock signal so that the test clock will be generated on the directly following rising edge of the system clock signal.

7. The scan test circuit of claim 1, wherein the latch tri-state inverter is a data tri-state inverter.

8. The scan test circuit of claim 1, wherein the test clock signal is generated according to the system clock signal and the test enable signal.

9. The scan test circuit of claim 8, further comprising:
   a clock generator for generating the test clock signal, comprising:
      a NAND gate having a first input coupled to the test enable signal and a second input coupled to the system clock signal, for generating an inverted test clock signal; and
      an inverter coupled to the NAND gate, for generating the test clock signal.

10. The scan test circuit of claim 8, wherein the test clock signal is generated according to a rising edge of the system clock signal.

11. The scan test circuit of claim 10, wherein the test enable signal is enabled at a time between a falling edge and a directly following rising edge of the system clock signal so that the test clock will be generated on the directly following rising edge of the system clock signal.

\* \* \* \* \*